(12) United States Patent
Veis

(10) Patent No.: US 11,351,773 B2
(45) Date of Patent: Jun. 7, 2022

(54) PRINTING FLUID DRYING ASSEMBLY WITH NON-UNIFORM HEATING PATTERN, METHOD AND SYSTEM

(71) Applicant: HP SCITEX LTD., Netanya (IL)

(72) Inventor: Alex Veis, Kadima (IL)

(73) Assignee: HP SCITEX LTD., Netanya (IL)

( * ) Notice: Subject to any disclaimer, the term of this patent is extended or adjusted under 35 U.S.C. 154(b) by 422 days.

(21) Appl. No.: 16/034,555

(22) Filed: Jul. 13, 2018

(65) Prior Publication Data
US 2019/0105684 A1    Apr. 11, 2019

(30) Foreign Application Priority Data

Oct. 10, 2017    (EP) ..................................... 17195744

(51) Int. Cl.
*B41J 11/00*    (2006.01)
*B41F 23/04*    (2006.01)
(Continued)

(52) U.S. Cl.
CPC .............. *B41F 23/045* (2013.01); *B05C 9/14* (2013.01); *B41F 23/0409* (2013.01);
(Continued)

(58) Field of Classification Search
CPC ...... B05D 3/067; B41F 23/045; B41J 11/002; B41J 11/0021; B41J 11/0212; B41J 11/00216; B41J 11/00218; B41J 11/0022; B41J 11/0024; B41J 11/00222; B41J 11/00242; B41J 11/00244; F26B 3/28
See application file for complete search history.

(56) References Cited

U.S. PATENT DOCUMENTS 3,831,289 A    8/1974  Knight
6,447,112 B1 *  9/2002  Hu ........................ B41J 11/0015
                                                     347/102
(Continued)

FOREIGN PATENT DOCUMENTS

CN    101152784    4/2008
CN    101687414    3/2010
(Continued)

OTHER PUBLICATIONS

Stowe, R.W. "UV Q&A: Temperature and UV Curing". 2017, "https://wuvebtch.com/articles/2017/temperature-and-uv-curing". pp. 1-3. 2017.*
(Continued)

*Primary Examiner* — Karl Kurple
(74) *Attorney, Agent, or Firm* — Fabian VanCott

(57) ABSTRACT

A drying assembly comprises a plurality of electromagnetic energy sources arranged to dry printing fluid deposited onto a surface of a substrate, by evaporation of a solvent fluid therefrom. The drying assembly further comprises a conveyor system configured to move the substrate in a conveying direction, and a focusing system configured to focus electromagnetic energy from the plurality of electromagnetic energy sources to form a non-uniform heating pattern on the surface of the substrate. The non-uniform heating pattern comprises a plurality of spatially separated higher and lower intensity regions distributed along the conveying direction.

20 Claims, 8 Drawing Sheets

(51) Int. Cl.
*B05C 9/14* (2006.01)
*B41M 5/00* (2006.01)
*B41M 7/00* (2006.01)
*H01L 21/67* (2006.01)
*F26B 3/28* (2006.01)
*B05D 3/06* (2006.01)
*B05D 3/10* (2006.01)

(52) U.S. Cl.
CPC .......... *B41J 11/002* (2013.01); *B41J 11/0021* (2021.01); *B41J 11/00214* (2021.01); *B41J 11/00218* (2021.01); *B41J 11/00242* (2021.01); *B41J 11/00244* (2021.01); *B41M 5/0011* (2013.01); *B41M 7/0081* (2013.01); *H01L 21/67115* (2013.01); *B05D 3/061* (2013.01); *B05D 3/067* (2013.01); *B05D 3/108* (2013.01); *B41J 11/0022* (2021.01); *F26B 3/28* (2013.01)

(56) References Cited

U.S. PATENT DOCUMENTS

| | | | | |
|---|---|---|---|---|
| 6,807,906 | B1* | 10/2004 | DeMoore | B41F 23/0443 101/424.1 |
| 6,854,841 | B1 | 2/2005 | Unter | |
| 7,731,324 | B2 | 6/2010 | Nagashima | |
| 7,896,485 | B2 | 3/2011 | Lafleche et al. | |
| 8,240,841 | B2 | 8/2012 | Caracciolo et al. | |
| 8,357,878 | B2 | 1/2013 | Leonhardt et al. | |
| 8,840,235 | B2 | 9/2014 | Blessing | |
| 9,073,359 | B2* | 7/2015 | Nakajima | B41J 11/002 |
| 9,855,769 | B2* | 1/2018 | Perez Gellida | B41J 11/002 |
| 2002/0100878 | A1* | 8/2002 | Summers | A61L 2/08 250/492.1 |
| 2003/0035037 | A1* | 2/2003 | Mills | B41J 2/01 347/102 |
| 2003/0227527 | A1* | 12/2003 | Richards | B41J 11/002 347/102 |
| 2004/0189769 | A1* | 9/2004 | Wilbur | B41J 11/002 347/102 |
| 2005/0104946 | A1* | 5/2005 | Siegel | B41F 23/0409 347/102 |
| 2006/0066703 | A1* | 3/2006 | Kadomatsu | B41J 11/002 347/102 |
| 2008/0035132 | A1 | 2/2008 | Katoh | |
| 2009/0207223 | A1 | 8/2009 | Cofler et al. | |
| 2010/0271449 | A1* | 10/2010 | Kusunoki | B41J 11/002 347/102 |
| 2012/0011737 | A1* | 1/2012 | Engin | F26B 3/343 34/184 |
| 2012/0095605 | A1* | 4/2012 | Tran | G05D 23/1923 700/285 |
| 2012/0206528 | A1 | 8/2012 | Nakajima | |
| 2013/0027459 | A1* | 1/2013 | Wada | B41J 11/002 347/16 |
| 2013/0316182 | A1* | 11/2013 | Mori | B05D 1/60 428/448 |
| 2014/0063096 | A1* | 3/2014 | Pitz | B05C 5/0212 347/9 |
| 2015/0097906 | A1 | 4/2015 | Beier et al. | |
| 2016/0297224 | A1* | 10/2016 | Edwards | C09D 11/037 |

FOREIGN PATENT DOCUMENTS

| | | |
|---|---|---|
| CN | 203752676 | 8/2014 |
| EP | 1905605 A1 | 4/2008 |

OTHER PUBLICATIONS

"What are Cylinder Lenses?", May 15, 2020, "www.edmundoptics.com/knowledge-center/application-notes/optics/what-are-cylinder-lenses/", pp. 1-3. (Year: 2020).*

"Electromagnetic", May 15, 2020, "www.dictionary.cambridge.org/dictionary/english/electromagnetic",Cambridge University Press, Cambridge Advanced Learner's Dictionary & Thesaurus, pp. 1-2. (Year: 2020).*

Aspherical Cylindrical Lens Array, SUMITA Optical Glass, Inc., Retrieved from the Internet on Aug. 3, 2017. Available at: http://www.sumita-opt.co.jp/en/products/molding/cylindrical-array.html.

Bird, M. "What is an Led Laser Printer?", Stinky Ink.com Ltd., Nov. 30, 2010, Available online at: https://www.stinkyinkshop.co.uk/blog/what-is-an-led-laser-printer/.

Chen, Hsi-Chao et al. "Rectangular illumination using a secondary optics with cylindrical lens for LED street light." Optics Express 21, No. 3 (2013): 3201-3212. Available at: https://www.osapublishing.org/DirectPDFAccess/98DE0551-BD91-000D-F35508DEA2747DAE_248886/oe-21-3-3201.pdf?da=1&id=248886&seq=0&mobile=no.

\* cited by examiner

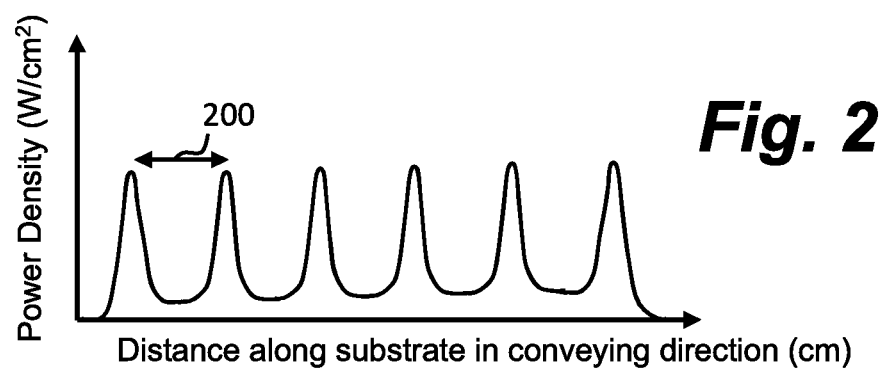

PRINTING FLUID DRYING ASSEMBLY WITH NON-UNIFORM HEATING PATTERN, METHOD AND SYSTEM

BACKGROUND

In an example printer system, printing fluid, such as ink, may be subjected to heat. For example, in an inkjet printer, ink fluid is deposited onto the surface of a substrate. Heat may be applied to the printed substrate to evaporate a liquid component of the ink, such as water and/or a non-aqueous solvent, to dry the printed substrate.

BRIEF DESCRIPTION OF THE DRAWINGS

Various features of the present disclosure will be apparent from the detailed description which follows, taken in conjunction with the accompanying drawings, which together illustrate features of the present disclosure, and wherein:

FIG. 2 is a graph showing the power density variation of the non-uniform heating pattern in a direction along a conveying direction;

DETAILED DESCRIPTION

Figure 1:
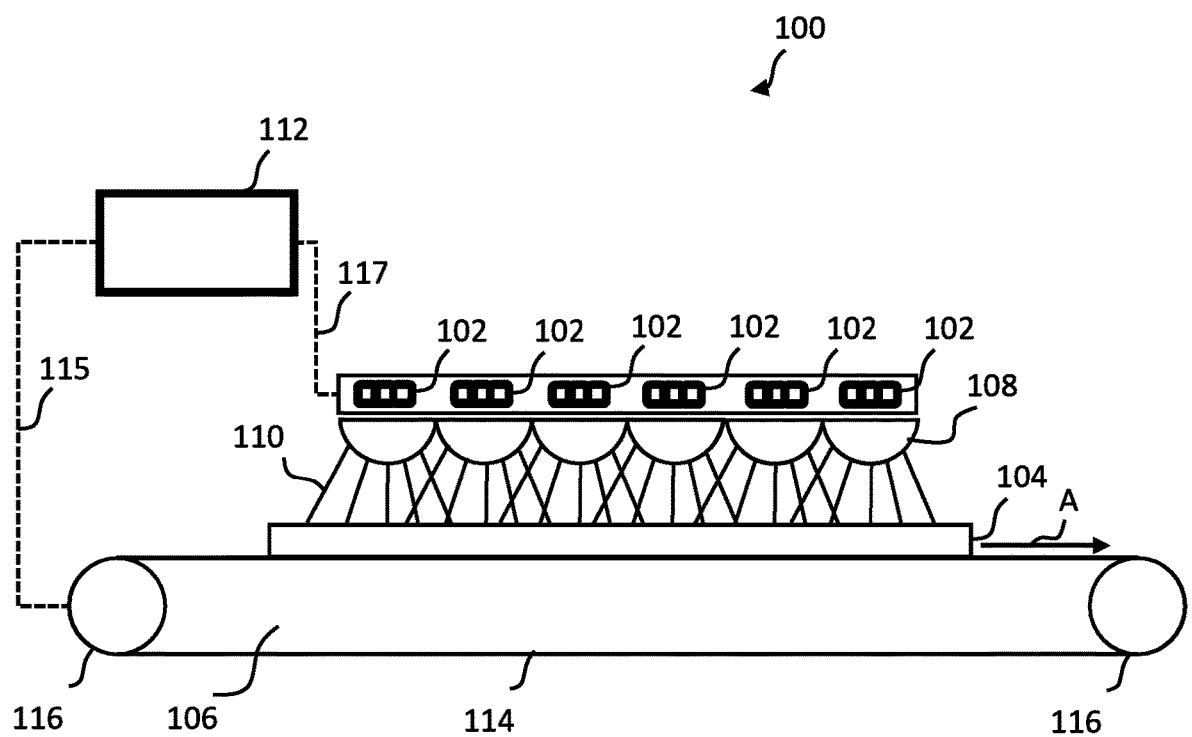
FIG. 1 is a schematic diagram showing a drying assembly in accordance with an example.

The preceding description has been presented to illustrate and describe examples of the principles described. This description is not intended to be exhaustive or to limit these principles to any precise form disclosed. Many modifications and variations are possible in light of the above teaching. It is to be understood that any feature described in relation to any one example may be used alone, or in combination with other features described, and may also be used in combination with any features of any other of the examples, or any combination of any other of the examples.

As described herein, an example drying assembly comprises a plurality of electromagnetic energy sources arranged to dry printing fluid deposited onto a surface of a substrate, by evaporation of a solvent fluid from the printing fluid. The assembly further comprises a conveyor system configured to move the substrate in a conveying direction, and a focusing system configured to focus electromagnetic energy from the plurality of electromagnetic energy sources to form a non-uniform heating pattern on the surface of the substrate. The non-uniform heating pattern comprises a plurality of spatially separated higher and lower intensity regions distributed along the conveying direction.

An example printing fluid, such as printing ink, may comprise solvents, such as water, glycol or the like, as well as at least one colourant, such as a pigment or dye. The example drying assembly causes evaporation of solvent fluids from the printing fluid through absorption of the electromagnetic energy by the colourant. Heat energy is absorbed by the colourant and transferred to the solvent fluids, which causes evaporation. This is in contrast to use of electromagnetic energy to cause polymerization of inks.

The example drying assemblies described herein apply heat to the surface of a substrate in a non-uniform heating pattern. The non-uniform heating pattern comprises a plurality of spatially separated higher and lower intensity regions distributed in a direction along an axis, such as a direction in which the substrate moves through the drying assembly. As a substrate is moved through the non-uniform heating pattern in the direction along the axis, locations on the surface of the substrate are subjected to higher and lower intensity electromagnetic energy exposure over time.

The term "higher intensity region" is defined as being a region in which the electromagnetic energy intensity is higher than the electromagnetic energy intensity in the "lower intensity region". "Higher intensity" is therefore not defined as being relative to the electromagnetic energy intensities found in "uniform" heating patterns, although in some examples this may also be true.

This non-uniform heating pattern can be achieved by focusing electromagnetic energy into regions of relatively higher and lower intensity energy density. A focusing system, such as a system comprising one or more lenses and/or mirrors, can be used to focus the energy in this manner. When printing fluid at a particular location on a substrate is subjected to the higher intensity energy exposure, evaporation is enhanced in this location. Furthermore, energy transfer to the substrate is reduced compared with constant intensity evaporation. The example drying assembly therefore provides improved energy efficiency. Additionally, the non-uniform heating pattern may allow saturated vapor dissipate by convection more effectively, and/or be removed via a vapor removal system, which also assists the efficiency of the drying process.

Each location on the substrate is therefore subjected to the alternate application of heat at higher and then lower levels. Accordingly, each location on the substrate experiences a "pulsed" heating effect as it passes through the plurality of higher and lower energy intensity regions.

The example drying assemblies described herein are in contrast to assemblies in which heat is applied uniformly to the entire surface of the substrate by impinging the surface with a uniform power density of the electromagnetic energy. "Power density" may also be referred to as "intensity".

It has been found that the application of a uniform energy density of electromagnetic energy can cause heat to be transferred into the substrate itself, lowering the efficiency of drying because energy is transferred away from the printing fluid. These printer systems are also often large. Furthermore, it has also been found that because each location on the substrate experiences this constant level of heat application due to the uniform nature of the heating pattern, the drying efficiency is limited because of the formation of solvent vapor in the vicinity of the surface of the substrate which takes time to dissipate. This vapor may reduce the efficiency of the drying process, for example by absorbing further heat energy itself, which is not transferred to the printer fluid.

The example drying assemblies described herein may comprise a vapor removal system to cause air to flow across the substrate to remove the saturated vapor. In some examples the air may not be heated, and instead, the air can be of a lower temperature, for example room temperature, or ambient temperature, as this is sufficient to remove the saturated vapor. Such a vapor removal system therefore saves energy in contrast to systems that also heat the air to enhance drying.

FIG. 1 is a schematic diagram showing a drying assembly 100 in accordance with an example. The drying assembly 100 comprises a plurality of electromagnetic energy sources 102 arranged to dry printing fluid deposited onto a surface of a substrate 104, by evaporation of a solvent fluid from the printing fluid. The drying assembly 100 further comprises a conveyor system 106 configured to move the substrate in a conveying direction, indicated by arrow A. The drying assembly 100 further comprises a focusing system 108 configured to focus electromagnetic energy from the plurality of electromagnetic energy sources to form a non-uniform heating pattern on the surface of the substrate 104.

In some examples, the drying assembly 100 further comprises, or is communicatively coupled to, a controller 112, which can control elements within the drying assembly 100. The controller 112 may comprise one or more processors for example. The controller 112 may further comprise memory, configured to store instructions that when executed, cause the processor to implement a method for drying printing fluid on the substrate 104. The memory may be a non-transitory computer-readable storage medium in some examples. The controller 112 may be connected directly or indirectly to the plurality of electromagnetic energy sources 102 and the conveyor system 106, via one or more communication paths 115, 117, shown depicted as dashed lines, to allow the transmission of data between the controller 112, the plurality of electromagnetic energy sources 102 and the conveyor system 106. In some examples, the controller 112 may also be in data communication with other elements of the drying assembly or other elements of a printer system.

In the example drying assembly 100, the plurality of electromagnetic energy sources 102 each comprise one or more light emitting diodes (LEDs), or one or more arrays of LEDs. In other examples, the plurality of electromagnetic energy sources 102 may comprise one or more laser diodes. In the example of FIG. 1, the plurality of electromagnetic energy sources 102 comprise ultraviolet (UV) LEDs configured to emit electromagnetic energy with wavelengths substantially in the UV range. For example, the UV LED may emit energy with wavelengths of about 395 nm or about 410 nm. Energy with these wavelengths are readily absorbed by Cyan, Magenta, Yellow and Black colourants and therefore cause evaporation of solvent fluids through heat transfer. It is to be appreciated that any suitable wavelength may be chosen depending upon the absorption spectra of the colourants present in the printing fluid. In this example, the LEDs emit electromagnetic energy with substantially constant intensity over time.

In the example of FIG. 1, the focusing system 108 comprises a plurality of cylindrical lenses, fixed in position. In other examples, other components, such as lenses, mirrors or prisms, may be used to focus the electromagnetic energy. Electromagnetic energy emitted from the LEDs is incident upon the focusing system 108 before being focussed into high intensity regions on the surface of the substrate 104. Between each high intensity region are lower intensity regions. The focussed electromagnetic energy is depicted by rays 110.

The example conveyor system 106 of FIG. 1 comprises a belt 114 and a plurality of rollers 116. Together, the belt 114 and rollers 116 move, or transport the substrate 104 through the drying assembly 100 beneath the focusing system 108 and the electromagnetic energy sources 102. Arrow A depicts the direction moved by the substrate, and this direction may be defined as a conveying direction such that the substrate moves along an axis. The movement of the substrate through the non-uniform heating pattern allows each location on the substrate to be subjected to the regions of varying electromagnetic energy intensity. In other examples, other conveying systems may be used to transport the substrate 104.

In the example of FIG. 1, the drying assembly comprises an array of cylindrical lenses arranged adjacent to each other. The lenses are located between the plurality of electromagnetic energy sources 102 and the substrate 104. The lenses may be formed from a cylinder of suitable material, for example glass, quartz, or fused silica, with a refractive index selected to focus the electromagnetic energy onto the substrate 104. To form the non-uniform heating pattern in the direction of the conveying direction, the lenses may be displaced from the plurality of electromagnetic energy sources by a distance equal to, or substantially close to a focal length of the plurality of cylindrical lenses. By placing the electromagnetic energy sources close to the focal point, the non-uniform power density heating pattern can be achieved. Accordingly, adjacent rays of electromagnetic energy 110 emerging from the surface of the lenses are non-parallel and therefore form regions of higher and lower intensity in the conveying direction, rather than a region of substantially uniform intensity. It will be appreciated that other methods of arranging the focusing system 108 and electromagnetic energy sources 102 may be provided to achieve the non-uniform heating pattern.

FIG. 2 depicts a graph showing the power density variation of the non-uniform heating pattern in a direction along a conveying direction. As can be seen, the focusing system 108 focuses the electromagnetic energy into regions of higher intensity at certain locations along the conveying direction.

In one example, the peak power density of the non-uniform heating pattern can be greater than about 40 W/cm$^2$, for example it may be about 60 W/cm$^2$. The average power density across the whole substrate may be around 16 W/cm$^2$, for example.

In a particular example, when the peak power density is about 40 W/cm$^2$, to about 60 W/cm$^2$, with an average power density of 16 W/cm$^2$, the efficiency of the drying process in the higher intensity regions may be increased by about 10% to about 30% when compared to constant heating with a uniform energy density of about 16 W/cm$^2$.

In some examples, the focusing system 108 is arranged such that the distance 200 between adjacent higher intensity regions is about 0.5 cm to about 5 cm along the conveying direction. Furthermore, in some examples, adjacent higher intensity regions are equally spaced along the conveying direction. This spacing allows heat that has been absorbed by the substrate, to dissipate and for mass transfer of the solvent vapor to take place. Hence, having equally spaced regions means that the "relaxation" time between pulses of higher intensity electromagnetic exposure is equal. In other examples however, adjacent higher intensity regions are not equally spaced. For example, the distance between adjacent higher intensity regions, may increase further along the conveying direction because there will likely be less solvent present in the printing fluid by this point.

Figure 3A:
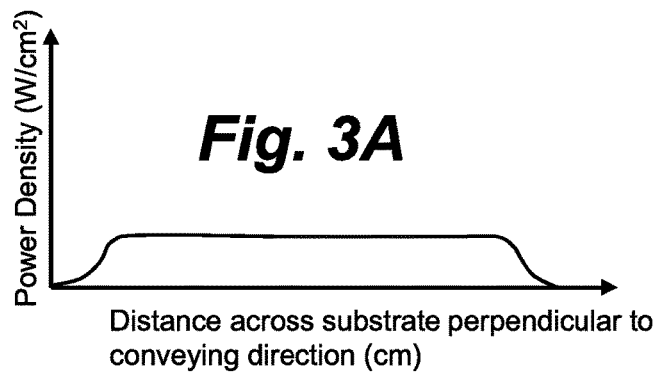
FIG. 3A is a graph showing the substantially constant power density of the heating pattern in a direction perpendicular to the conveying direction.
Figure 3B:
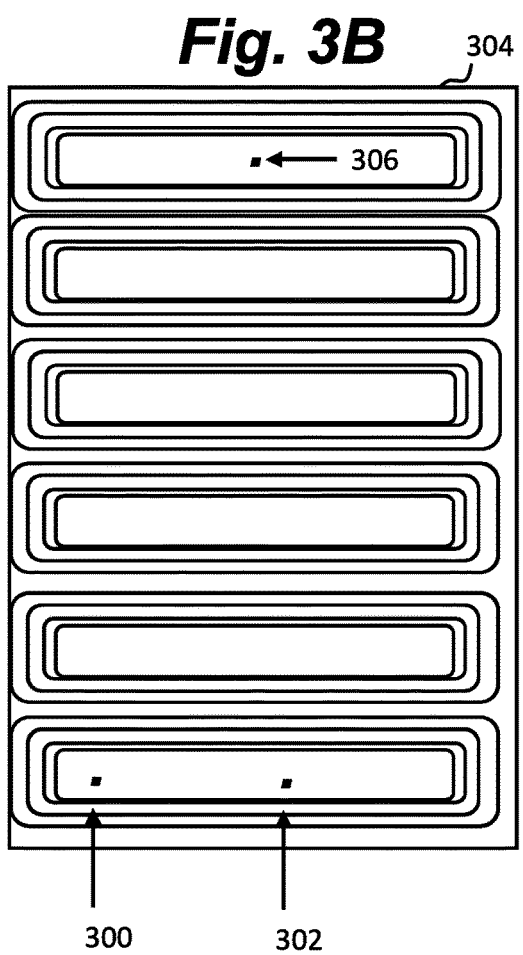
FIG. 3B is a heat map showing the power density variation of the heating pattern on the surface of a substrate at a first time.

As described, the focusing system allows the plurality of spatially separated higher and lower intensity regions of electromagnetic energy density to be formed in a direction along the conveying direction A. In some examples, the focusing system is further configured to focus the electromagnetic energy from the plurality of electromagnetic energy sources to form regions of substantially constant intensity across the surface of the substrate in a direction perpendicular to the conveying direction. FIG. 3A depicts a graph showing this substantially constant power density across the surface of the substrate in a direction perpendicular to the conveying direction. FIG. 3B depicts a top-down view of the power density variation of the heating pattern on the substrate 304 at a first time $t_1$. This heat-map shows "contours" of the power density as it varies across the whole surface of the substrate. The power density varies from the higher intensity central regions of the contours to the lower intensity regions between adjacent peaks. The direction perpendicular to the conveying direction is indicated by arrow B.

FIG. 3B therefore depicts the non-uniform heating in the direction along the conveying direction A, and the "uniform" nature of the heating in the direction B. Therefore, in a line extending across the substrate in the direction perpendicular to the conveying direction, the heating pattern is substantially uniform in nature while in a line extending along the conveying direction the heating pattern is non-uniform in nature. The regions of substantially constant intensity in the direction perpendicular to the conveying direction ensures that all locations across the substrate are dried adequately. Therefore, at any one time, locations 300 and 302 arranged along an axis in the direction B would both be subjected to the same intensity electromagnetic exposure.

Printing fluid is shown deposited on the substrate 304 at a location 306. At time $t_1$, the printing fluid at location 306 is being exposed to the maximum intensity of electromagnetic energy.

Figure 3C:
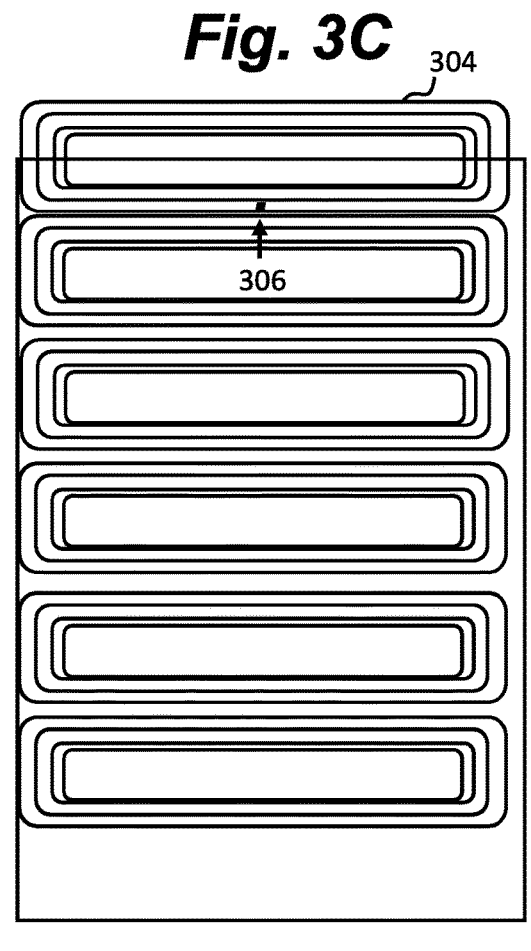
FIG. 3C is a heat map showing the power density variation of the heating pattern on the surface of a substrate at a second time.

FIG. 3C depicts a top-down view showing the position of the substrate 304 relative to the power density variation of the heating pattern on the substrate 304 at a second, later time $t_2$. Between times $t_1$ and $t_2$ the substrate 304 has been moved in the conveying direction by a distance equal to half of distance 200 (indicated in FIG. 2), such that the printing fluid at location 306 is now located within a lower intensity region. At a later time t3, (not shown) once the substrate 304 has moved the full distance 200, location 306 will again be exposed to the maximum heating intensity of the adjacent peak in the heating pattern. Hence, as the substrate 304 moves through the heating pattern, a location on the substrate 304 experiences alternating higher and lower intensity heating levels.

In one example, the conveyor system transports the substrate at a speed of about 0.1 m/s to 5 m/s. For example, the transport speed may be 25 cm/s or 30 cm/s. Accordingly, a location on the surface of the substrate may move between two adjacent higher intensity regions in a period of about 1 ms to about 500 ms. For example, at a speed of 25 cm/s, over a distance of 0.5 cm, the period may be about 20 ms, and for the same speed over a distance of 5 cm, the period may be about 200 ms. It will be appreciated however that these speeds and therefore periods are dependent upon the particular printing system, and may deviate from these examples.

Figure 4:
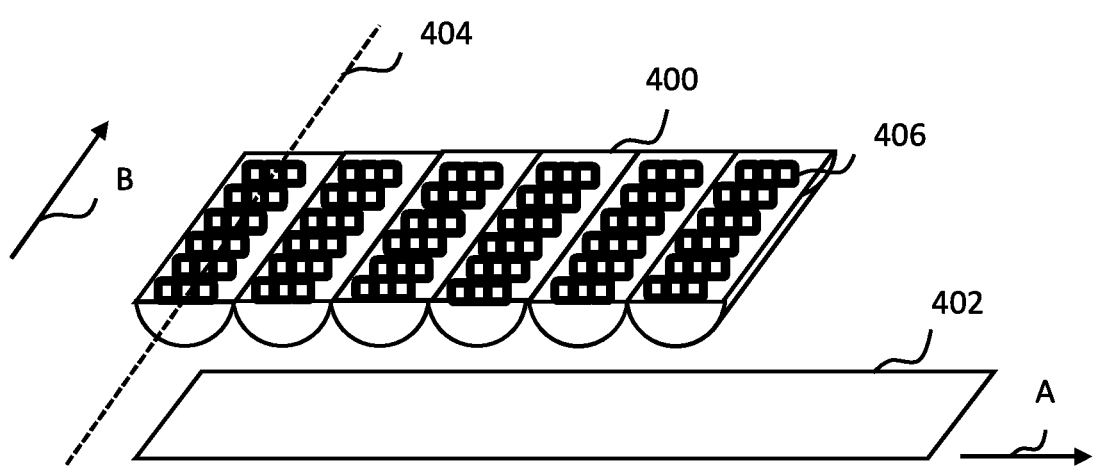
FIG. 4 is a schematic diagram showing a focusing system comprising a plurality of cylindrical lenses in accordance with an example.

FIG. 4 depicts a three-dimensional view of an example array of cylindrical lenses 400. In some examples, this array of cylindrical lenses 400 may be used to achieve the heating pattern shown in FIG. 3B. The focusing system may therefore comprise a plurality of cylindrical lenses 400, where the longitudinal axes 404 of the cylindrical lenses 400 extend in a direction substantially perpendicular to the conveying direction (in the direction indicated by arrow B) and generally parallel to the surface of the substrate 402. In FIG. 1, the longitudinal axes of the cylindrical lenses extend into the page.

In one example, the cylindrical lenses 400 may have a length in the direction of the longitudinal axis 404, that is greater than a dimension of the substrate 402 in the same direction, to ensure that the whole surface of the substrate 404 is subjected to heat. In other examples, multiple cylindrical lenses are arranged adjacent to each other in the direction perpendicular to conveying direction and generally parallel to the surface of the substrate so that the total combined length is greater than a dimension of the substrate in the same direction.

In these examples, a plurality of electromagnetic energy sources 406 are arranged along the length of the cylindrical lenses, as well as being arranged along the conveying direction A. In some examples the electromagnetic energy sources 406 are spaced evenly along the cylindrical lenses.

In the example of FIG. 4, the plurality of cylindrical lenses are separate, however in some examples the focusing system may be formed from a single piece of material.

Figure 5:
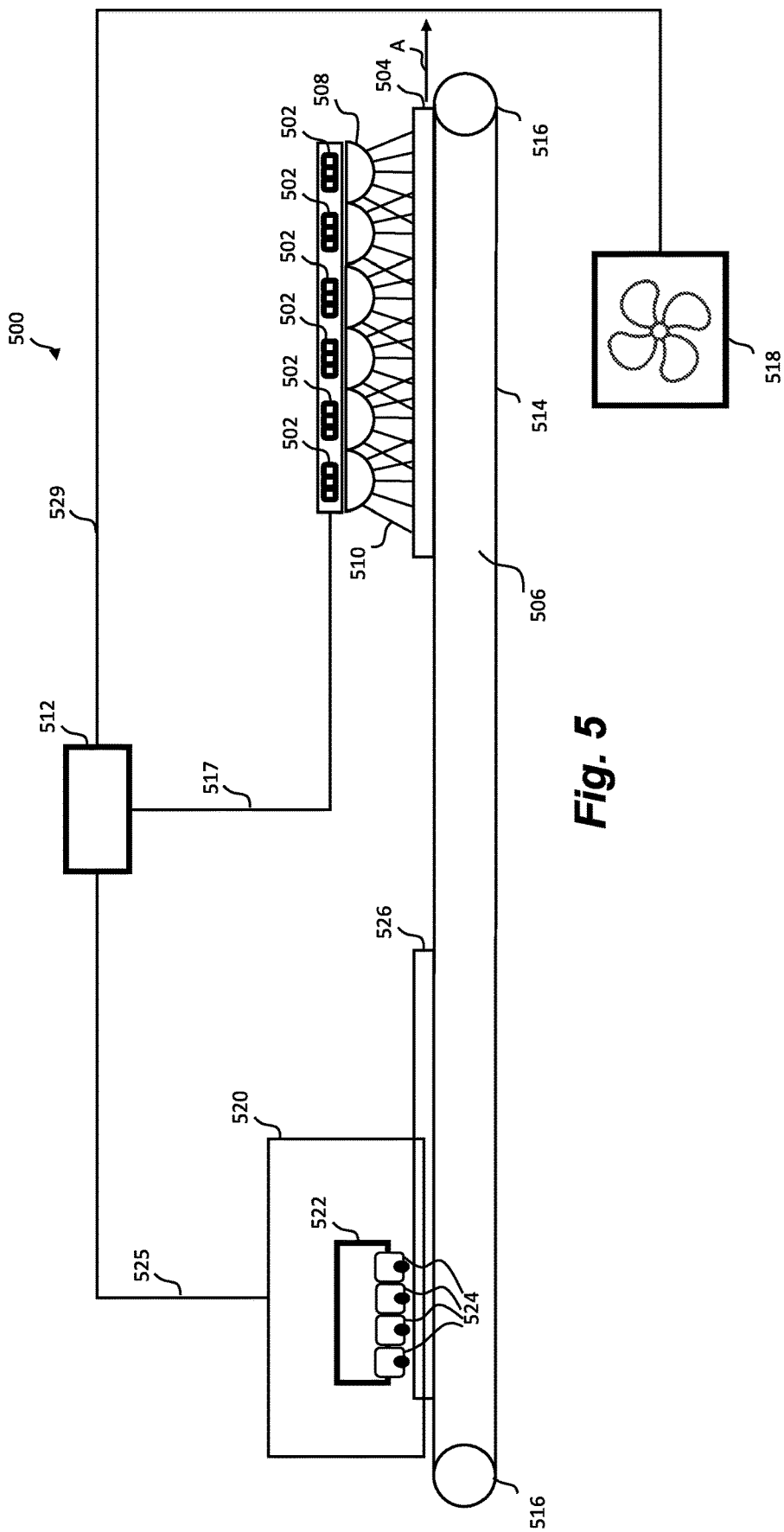
FIG. 5 is a schematic diagram showing a first system in accordance with an example.

FIG. 5 is a schematic diagram showing a system 500 in accordance with an example. The system 500 comprises a printer apparatus 520, configured to deposit printing fluid onto a surface of a substrate 526, 504. The system 500 further comprises a conveyor system 506, configured to move the substrate 526, 504 in a conveying direction, and a drying assembly. In some examples the conveyor system 506 is part of the printer apparatus 520 and/or the drying assembly.

The drying assembly and the conveyor system 506 may comprise components substantially similar to those depicted in FIG. 1. Therefore, in FIG. 5, components and features that are the same as or similar to the corresponding components and features of the example described with reference to FIG. 1 have the same reference numeral but beginning with "5" not "1". For the sake of brevity, the description of those components and features will not be repeated in its entirety here. It will be understood that the arrangements and alternatives, etc. described above in relation to the example of FIG. 1 are also applicable to the example of FIG. 5.

The drying assembly therefore comprises a plurality of electromagnetic energy sources 502 arranged to dry the printing fluid by evaporation of a solvent fluid therefrom, and a focusing system 508 configured to focus electromagnetic energy from the plurality of electromagnetic energy sources 502 to form a non-uniform heating pattern on the surface of the substrate 504 in use.

In this example, the printer apparatus 520 may be an inkjet printer, for example. The system 500 may further comprise a controller 512 to control operations of the system 500, and it may be substantially the same, and operate substantially the same, as that shown in FIG. 1.

The printer apparatus 520 may comprise one or more printing elements 524 configured to deposit ink onto the substrate 526, 504. In the example of FIG. 5, the printer system 500 comprises four printing elements 524, however it will be appreciated that the system 500 may comprise any number of printing elements 524 as needs dictate. The printing elements 524 may be located on one or more print heads 522. The one or more printing elements 524 may be connected directly or indirectly to the controller 524 via one or more communication paths 525, shown depicted as a dashed line, to allow the transmission of data.

The one or more printing elements 524 can deposit ink directly onto the substrate 526, 504 to create an image on the substrate. Once ink has been deposited onto the substrate 526, 504 the substrate is transported through the system 500 by the conveyor system 506, to the drying assembly. Here the ink is dried, as described above.

It has been found that delaying the drying by a threshold period of time after printing, allows non-volatile solvents to be absorbed into the substrate, assisting the drying procedure. Delaying the drying in this manner decreases the time it takes for the ink film on the substrate to solidify and therefore increases the drying efficiency.

In some examples, the drying is delayed by a period of around 2 seconds to about 10 seconds before applying heat to the substrate. Suitable delays can be achieved by varying the speed at which the conveyor system 506 moves the substrate through the system, and/or by varying the separation distance between the printer apparatus and the drying assembly.

In one example, the conveyor system transports the substrate at a speed of about 0.1 m/s to 5 m/s. Accordingly, the drying assembly may typically be located at a distance of about 1 m to about 10 m from a region in which the printer apparatus deposits the printing fluid onto the surface of the substrate. However, in other printing systems a delay in drying is not needed, depending upon the type of printing fluid and substrate. In that case, the drying assembly may be located close to the printer apparatus, for example they may be separated by a distance of about 0 m, i.e. they are immediately adjacent to each other In one example, the drying assembly may be located at a distance of about 6 m to about 8 m from a region in which the printer apparatus deposits the printing fluid onto the surface of the substrate. By separating the drying assembly from the printing apparatus 520 by these example distances, the drying efficiency can be optimised. It will be appreciated that other distances will be suitable if the transport speed varies. Furthermore, it will be appreciated that the distance travelled by the substrate may be non-linear in some examples, and therefore it can be the distance travelled by the substrate, or the time taken to travel, which results in the delayed drying, rather than the physical separation of the drying assembly and the printing apparatus.

The system 500, or the drying assembly may further comprise a vapor removal system 518, configured to remove solvent vapor from the vicinity of the substrate 504. The solvent vapor may be removed by causing air to flow across the substrate. In one example, the vapor removal system 518 removes the vapor via suction, which causes air to flow across the substrate towards the vapor removal system 518. In another example, the vapor removal system 518 removes the vapor by blowing air across the substrate, which causes air to flow across the substrate away from the vapor removal system 518. In some examples, the air flowing across the substrate is at room temperature, or ambient temperature. For example, the air flowing across the substrate is not additionally heated and is instead at the temperature of the air in the vicinity of the drying apparatus. This means that such a vapor removal system 518 uses less energy than vapor removal systems in which hot air is blown onto the substrate. The vapor removal system 518 may be connected directly or indirectly to the controller 524 via one or more communication paths 529, shown depicted as a dashed line, to allow the transmission of data.

In some examples, the drying assembly may comprise a housing (not shown), where the housing contains the plurality of electromagnetic energy sources 502, at least a portion of the conveyor system 506, and the focusing system 508. In one example, the housing may be small or compact, having length dimensions of about 0.5 m (in the direction of arrow A), height dimensions of about 0.5 m and width dimensions of about 2 m. The width dimension may be smaller or larger in other examples, depending on a maximum width of a substrate.

Figure 6:
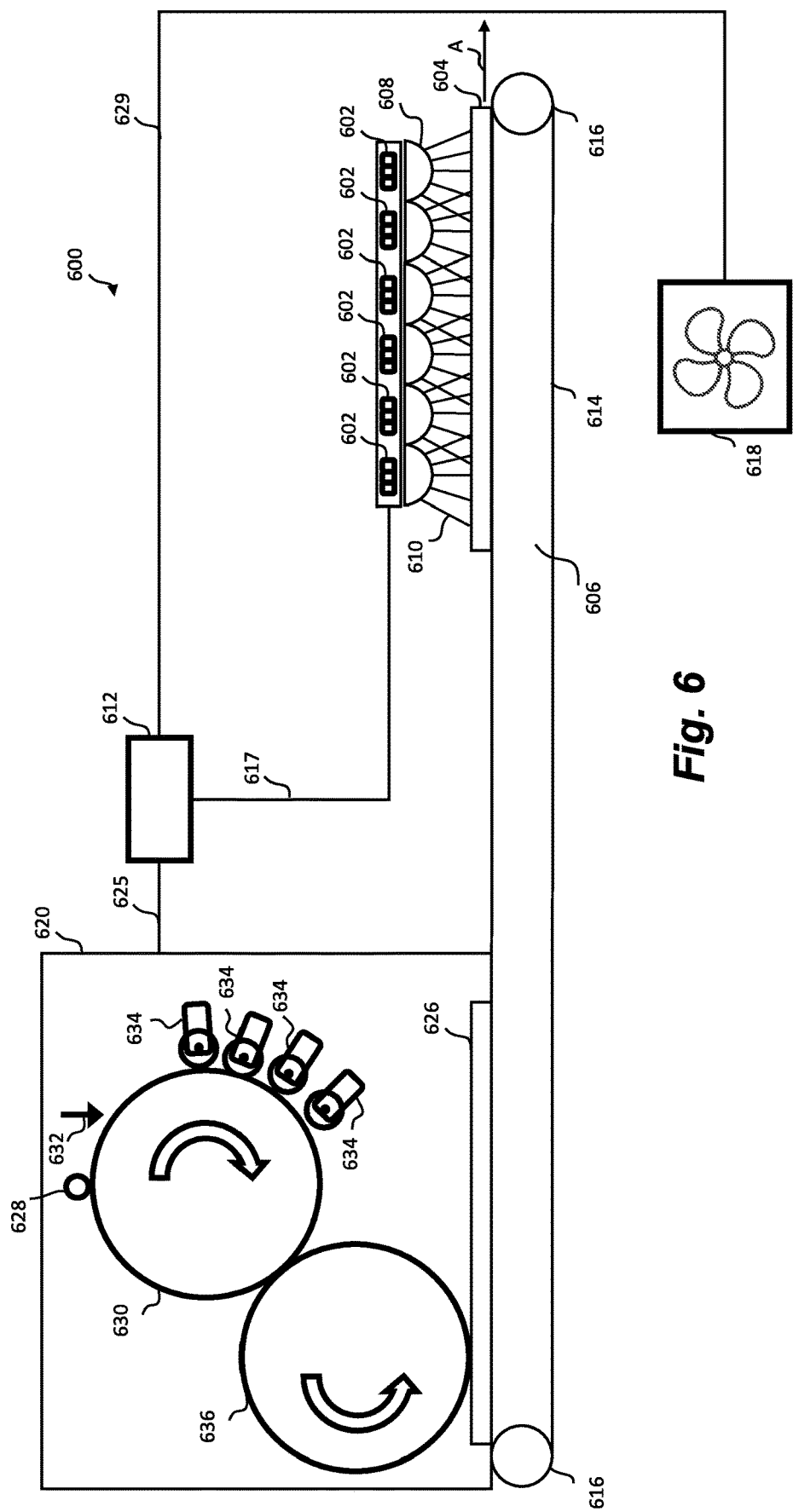
FIG. 6 is a schematic diagram showing a second system in accordance with an example.

FIG. 6 is a schematic diagram showing a system 600 in accordance with a second example. The system 600 comprises a printer apparatus 620, configured to deposit printing fluid onto a surface of a substrate 626, 604.

The drying assembly and the conveyor system 606 may comprise components substantially similar to those depicted in FIG. 1 and FIG. 5. Therefore, in FIG. 6, components and features that are the same as or similar to the corresponding components and features of the example described with reference to FIG. 5 have the same reference numeral but beginning with "6" not "1". For the sake of brevity, the description of those components and features will not be repeated in its entirety here. It will be understood that the arrangements and alternatives, etc. described above in relation to the examples of FIGS. 1 and 5 are also applicable to the example of FIG. 6.

In this example, the printer apparatus 620 may be an offset electrophotographic printer, for example. The controller 612 may be in data communication with the printer apparatus 620, and various components of the printer apparatus 620. For example, the controller 612 may be in direct or indirect communication with printing elements 634, an imaging unit 632, a photo charging unit 628, a photo imaging plate (PIP) 630 and a transfer element 636, however these communication paths are omitted for simplicity.

Briefly, the photo charging unit 628, such as a corona wire, can deposit static charge onto the PIP 630. As the PIP 630 rotates, it passes under the imaging unit 632 where charge is dissipated in selected portions of the PIP 630 to leave an invisible electrostatic charge pattern that corresponds to the image to be printed. In an example, the imaging unit 632 comprises one or more lasers. Ink is then transferred to the PIP 630 by at least one of the printing elements 634. The layers of ink from each of the printing elements 634 can then be transferred to the transfer element 636, either individually or together, before being deposited onto the substrate 626 to form the image.

Figure 7:
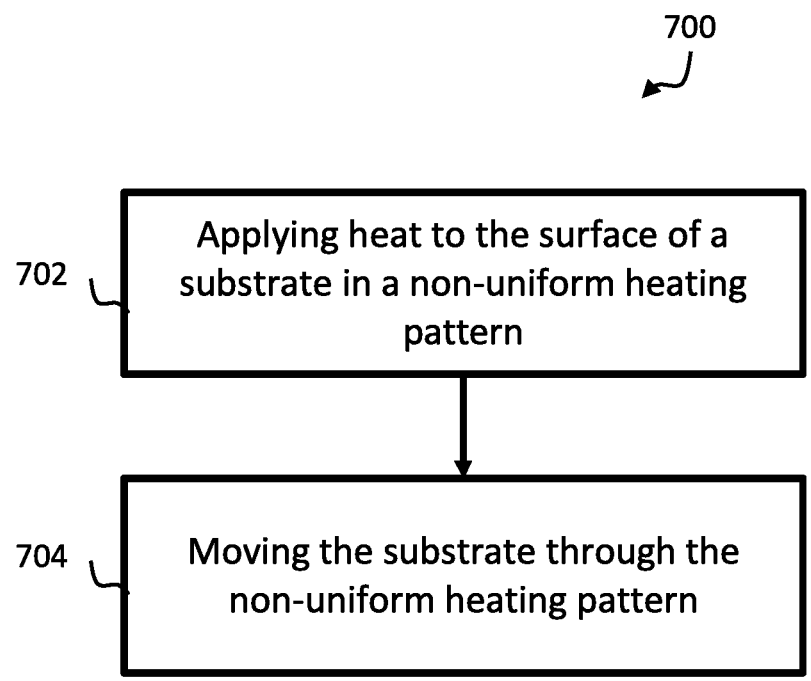
FIG. 7 is a flow diagram showing a method in accordance with an example.

FIG. 7 is a flow diagram showing a method 700. The method can be performed by the example drying assembly 100 and/or the system 500, 600 discussed in relation to FIGS. 1-6. At block 702, the method comprises applying heat to the surface of a substrate in a non-uniform heating pattern, the substrate comprising printing fluid deposited at a plurality of locations on the surface of the substrate, the non-uniform heating pattern comprising a plurality of spatially separated higher and lower intensity regions distributed in a direction along an axis. At block 702, the method comprises moving the substrate through the non-uniform heating pattern in the direction along the axis, thereby subjecting each of the plurality of locations to higher and lower intensity electromagnetic energy over time, to evaporate a solvent fluid from the printing fluid.

In some example methods, the method may further comprise applying heat of substantially constant intensity across the surface of the substrate in a direction perpendicular to the axis.

In some example methods, the method may further comprise causing air to flow across the substrate at an ambient temperature, thereby removing solvent vapor from the vicinity of the substrate.

In some example methods, applying heat to the surface of the substrate in the non-uniform heating pattern may comprise causing a plurality of electromagnetic energy sources to emit electromagnetic energy, and passing at least a portion of the emitted electromagnetic energy through a plurality of cylindrical lenses arranged at a distance from the plurality of electromagnetic energy sources, wherein the distance is substantially equal to a focal length of the plurality of cylindrical lenses.

In some example methods, adjacent higher intensity regions are equally spaced along the axis.

In some example methods, a location on the surface of the substrate may move between two adjacent higher intensity regions in a period of about 0.02 seconds to about 0.2 seconds.

In some example methods, a location on the surface of the substrate may move between two adjacent higher intensity regions in a period of about 0.001 seconds to about 0.5 seconds.

In some example methods, adjacent higher intensity regions are separated by a distance of about 0.5 cm to about 5 cm along the conveying direction.

In some example methods, the method may further comprise depositing printing fluid at the plurality of locations on the surface of the substrate, and waiting for a period of about 2 seconds to about 10 seconds after the depositing printing fluid before applying the heat to the surface of the substrate in the non-uniform heating pattern.

Certain system components and methods described herein may be implemented by way of non-transitory computer program code that is storable on a non-transitory storage medium. In some examples, the controller 112 may comprise a non-transitory computer readable storage medium comprising a set of computer-readable instructions stored thereon. The controller 112 may further comprise one or more processors 804. In some examples, control may be split or distributed between two or more controllers 112 which implement all or parts of the methods described herein.

Figure 8:
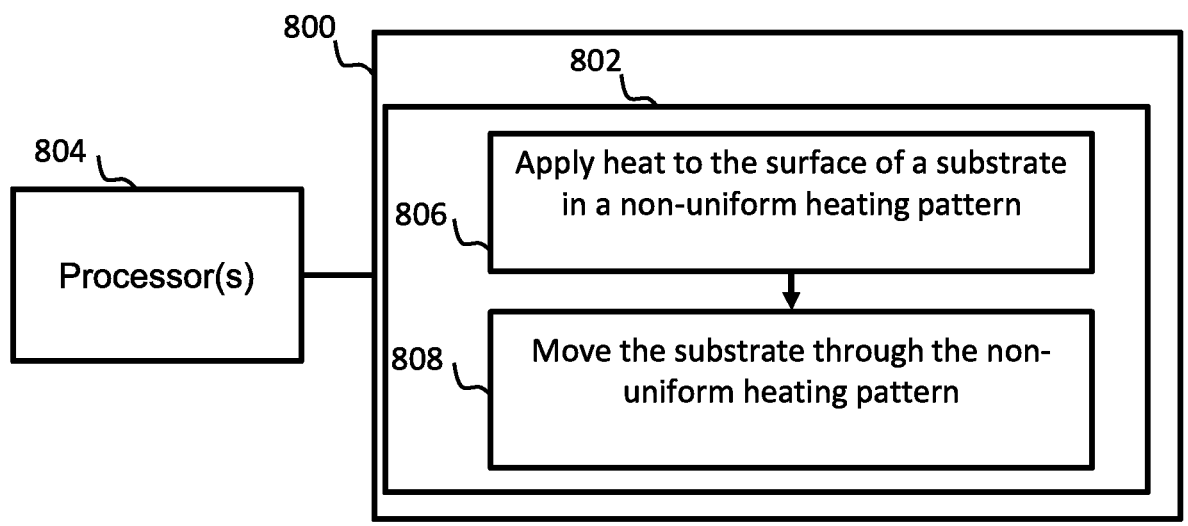
FIG. 8 is a diagrammatic representation of an example set of computer-readable instructions within a non-transitory computer-readable storage medium.

FIG. 8 shows an example of such a non-transitory computer-readable storage medium 800 comprising a set of computer readable instructions 802 which, when executed by at least one processor 804, cause the processor(s) 804 to perform a method according to examples described herein. The computer readable instructions 800 may be retrieved from a machine-readable media, e.g. any media that can contain, store, or maintain programs and data for use by or in connection with an instruction execution system. In this case, machine-readable media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc.

In an example, instructions 802 cause the processor 804 in a drying apparatus to, at block 806 apply heat to the surface of a substrate in a non-uniform heating pattern, the substrate comprising printing fluid deposited at a plurality of locations on the surface of the substrate, the non-uniform heating pattern comprising a plurality of spatially separated higher and lower intensity regions distributed in a direction along an axis. At block 808, the instructions 802 cause the processor 804 to move the substrate through the non-uniform heating pattern in the direction along the axis, thereby subjecting each of the plurality of locations to higher and lower intensity electromagnetic energy over time, to evaporate a solvent fluid from the printing fluid.

What is claimed is:

1. A drying assembly comprising:
a plurality of electromagnetic energy sources arranged to dry a printing fluid deposited onto a surface of a substrate, by evaporation of a solvent fluid therefrom;
a conveyor system configured to move the substrate in a conveying direction; and
a focusing system configured to focus electromagnetic energy from the plurality of electromagnetic energy sources to form a non-uniform heating pattern on the surface of the substrate when conveyed along the conveying direction;
wherein the non-uniform heating pattern comprises a plurality of spatially separated higher and lower intensity regions distributed along the conveying direction.

2. A drying assembly according to claim 1, wherein the focusing system is configured to focus the electromagnetic energy from the plurality of electromagnetic energy sources to form regions of substantially constant intensity across the surface of the substrate in a direction perpendicular to the conveying direction.

3. A drying assembly according to claim 1, further comprising a vapor removal system configured to remove a solvent vapor from the vicinity of the substrate via suction.

4. A drying assembly according to claim 1, wherein the focusing system comprises a plurality of cylindrical lenses displaced from the plurality of electromagnetic energy sources by a distance substantially equal to a focal length of the plurality of cylindrical lenses.

5. A drying assembly according to claim 1, wherein the focusing system is arranged such that the higher intensity regions are equally spaced along the conveying direction.

6. A drying assembly according to claim 1, wherein adjacent higher intensity regions are separated by a distance of about 0.5 cm to about 5 cm along the conveying direction.

7. A method of operating the drying assembly of claim 1, the method comprising:
with the focusing system, applying heat to the surface of the substrate in a non-uniform heating pattern, the substrate comprising the printing fluid deposited at a plurality of locations on the surface of the substrate, the non-uniform heating pattern comprising the plurality of spatially separated higher and lower intensity regions distributed in the conveying direction along an axis; and
with the conveyor system, moving the substrate through the non-uniform heating pattern in the direction along the axis, thereby subjecting each of the plurality of locations to higher and lower intensity electromagnetic energy over time, to evaporate the solvent fluid from the printing fluid.

8. A method according to claim 7, further comprising applying heat of substantially constant intensity across the surface of the substrate in a direction perpendicular to the axis.

9. A method according to claim 7, further comprising causing air to flow across the substrate at an ambient temperature, thereby removing a solvent vapor from the vicinity of the substrate.

10. A method according to claim 7, wherein applying heat to the surface of the substrate in the non-uniform heating pattern comprises:
causing the plurality of electromagnetic energy sources to emit electromagnetic energy; and passing at least a portion of the emitted electromagnetic energy through a plurality of cylindrical lenses arranged at a distance from the plurality of electromagnetic energy sources, wherein the distance is substantially equal to a focal length of the plurality of cylindrical lenses.

11. A method according to claim 7, wherein adjacent higher intensity regions are equally spaced along the axis.

12. A method according to claim 7, wherein a location on the surface of the substrate moves between two adjacent higher intensity regions in a period of about 0.001 seconds to about 0.5 seconds.

13. A method according to claim 7, further comprising: depositing the printing fluid at the plurality of locations on the surface of the substrate; and waiting for a period of about 2 seconds to about 10 seconds after the depositing the printing fluid before applying the heat to the surface of the substrate in the non-uniform heating pattern.

14. A system comprising:
a printer apparatus configured to deposit a printing fluid onto a surface of a substrate;
a conveyor system configured to move the substrate in a conveying direction; and
a drying assembly, the drying assembly comprising:
a plurality of electromagnetic energy sources arranged to dry the printing fluid by evaporation of a solvent fluid therefrom; and
a focusing system configured to focus electromagnetic energy from the plurality of electromagnetic energy sources to form a non-uniform heating pattern on the surface of the substrate when conveyed along the conveying direction;
wherein the non-uniform heating pattern comprises a plurality of spatially separated higher and lower intensity regions distributed along the conveying direction.

15. A system according to claim 14, wherein the drying assembly is located at a distance of about 1 m to about 10 m from a region in which the printer apparatus deposits the printing fluid onto the surface of the substrate.

16. A drying assembly according to claim 1, wherein the non-uniform heating pattern comprises multiple higher intensity regions and multiple lower intensity regions that alternate along the conveying direction, the lower intensity regions being heated with a non-zero application of energy from the electromagnetic energy sources, the higher intensity regions being heated with a greater application of energy from the electromagnetic energy sources.

17. A drying assembly according to claim 1, wherein the focusing system is arranged to provide a non-zero application of energy from the electromagnetic energy sources at the lower intensity regions of the non-uniform heating pattern.

18. A drying assembly according to claim 1, further comprising a vapor removal system to circulate air at ambient temperature in the drying assembly to remove a vapor released by heating under the non-uniform heating pattern.

19. A drying assembly according to claim 1, wherein the plurality of electromagnetic energy sources comprise light emitting diodes.

20. A drying assembly according to claim 1, wherein a distance between adjacent higher intensity regions increases along the conveying direction.

* * * * *